(12) United States Patent
Chan et al.

(10) Patent No.: US 7,443,689 B2
(45) Date of Patent: Oct. 28, 2008

(54) FASTENING STRUCTURE

(75) Inventors: Shih-Sheng Chan, Taipei (TW); Wen-Hung Huang, Tucheng (TW)

(73) Assignee: Hannspree, Inc. (TW)

( * ) Notice: Subject to any disclaimer, the term of this patent is extended or adjusted under 35 U.S.C. 154(b) by 635 days.

(21) Appl. No.: 11/090,164

(22) Filed: Mar. 28, 2005

(65) Prior Publication Data

US 2006/0134951 A1 Jun. 22, 2006

(30) Foreign Application Priority Data

Dec. 20, 2004 (TW) .............................. 93220506 U

(51) Int. Cl.
*H05K 5/00* (2006.01)
(52) U.S. Cl. .................... 361/730; 174/138 G
(58) Field of Classification Search ............. 174/138 D, 174/138 G; 361/730
See application file for complete search history.

(56) References Cited

U.S. PATENT DOCUMENTS

| | | | | |
|---|---|---|---|---|
| 4,938,703 A | * | 7/1990 | Nakano | ........................ 439/74 |
| 6,519,157 B1 | * | 2/2003 | Xing | ........................... 361/704 |
| 7,045,715 B2 | * | 5/2006 | Ono | ........................... 174/72 A |
| 7,257,870 B2 | * | 8/2007 | Deas et al. | .................... 24/453 |
| 2003/0147023 A1 | * | 8/2003 | Kang et al. | ................... 349/58 |

* cited by examiner

*Primary Examiner*—Jeremy C Norris
*Assistant Examiner*—Yuriy Semenenko
(74) *Attorney, Agent, or Firm*—Lowe Hauptman Ham & Berner, LLP

(57) ABSTRACT

A fastening structure has two clip blocks and two U-shaped conducting chips. The two clip blocks are connected with an elastic arm, and have an upward extending upper hook which can pass through and buckle with the penetrating hole on the circuit board. The two clip blocks are also formed with a downward extending lower hook which can pass through and buckle with the through hole on the backplane. The upper fold slice of each U-shaped conducting chip is sandwiched between the clip block and the circuit board, the lower fold chip is sandwiched between the clip block and the backplane, therefore, the circuit board can be fastened on the backplane by the clip blocks and also can achieve an electrical connection.

8 Claims, 5 Drawing Sheets

FASTENING STRUCTURE

RELATED APPLICATION

The present application is based on, and claims priority from, Taiwanese Application Number 093220506, filed Dec. 20, 2004, the disclosure of which is hereby incorporated by reference herein in its entirety.

BACKGROUND OF THE INVENTION

1. Field of the Invention

The invention relates to a fasten structure and more particularly, to a fasten structure on a circus board which is used for a display panel, for example, a liquid crystal display or a liquid crystal display TV.

2. Description of Related Art

In general electronic apparatus, for example, a liquid crystal display or a liquid crystal display TV, wherein it is provided with a circuit board and also electronic chips, capacitance and electronic inductance for various functions, then setting up the circuit board on the backplane of electronic apparatuses.

FIG. 1 is an exploded view of the prior art in backplane of liquid crystal display TV and circuit boards. It shows a backplane 91 and a circuit board 92 of liquid crystal display TV. The prior art of traditional setting manner is to lack circuit board 92 on the backplane 91 with a plurality of screws 93. For such design, it is essentially to lack cooper pillars 94 on the backplane 91 first. It not only increase the production cost of cooper pillars 94 and screws 93 but the process of lacking screws 93 is also cost labor and time consuming. Therefore, it is not an ideal way for control production cost.

Moreover, the location of the cooper pillars 94 on the backplane 91 is used for fasten so it is cooperated with the apertures 921 on the circuit board 92, therefore, the prior art of the traditional lacking method can only set on copper pillars 94 corresponded to the apertures 921 on the circuit board 92, one has to design the location of the copper pillars 94 according to the different sizes of the circuit board 92, so it's not agree with the purpose of using different sizes of circuit board on the same bakplane.

SUMMARY OF THE INVENTION

The main object of the present invention is to provide an apparatus for a fastening structure for fastening a circuit board onto a backplane of a display panel. The backplane is provided with at least two through holes, the circuit board is provided with at least two penetrating holes; the aforesaid fasten structure comprises two clip blocks, and two U-shaped conducting chips. The two clip blocks connected by an elastic arm therebetween which can be bended to each other, each clip block comprises an upper surface and a lower surface; the upper surfaces of the two clip blocks respectively formed upward with an upper hook that passes through and hook with the at least two penetrating holes of the circuit board; the lower surfaces of the two clip blocks formed downward with two lower hooks, respectively passes through and hook with the at least two through holes of the backplane; in addition, each U-shaped conducting chip comprises an upper fold slice, a lower fold slice, an upper opening located on the upper fold slice, and a lower opening located on the lower fold slice, the upper fold slices of the two U-shaped conducting chips respectively sandwiched between the upper surfaces of the two clip blocks and the circuit board, the upper openings sleeved onto the upper hooks correspondingly; the lower fold slices of the two U-shaped conducting chips respectively sandwiched between the lower surfaces of the two clip blocks and the backplane, the lower openings sleeved onto the lower hooks correspondingly.

Therefore, according to the structure mentioned above, the upper hooks and the lower hooks can fasten the circuit board and the backplane of the display panel, they also can achieve electric conduction by the two U-shaped conducting chips. The present invention avoids using traditional screw lacking method and lower the production cost of cooper pillars and screws in the prior art, furthermore, decrease labor and time consuming.

Moreover, to different sizes of the circuit board, it is provided with penetrating holes on the circuit board only depends on practical needs. Applying the present invention of the upper hooks and the lower hooks on the two clip blocks to fasten the circuit board on the backplane of the display panel and to achieve the objective for different sizes of circuit boards, in addition that the upper hooks and the lower hooks are not essentially setting in up-and-down corresponding but staggered depends on the practical needs.

The at least two through holes of the backplane of the display panel can be corresponded to the at least two penetrating holes of the circuit board. Each upper surface of the two clip blocks is provided with at least one upper elastic support arm, the upper elastic support arm is up against the circuit board, each lower surface of the two clip blocks is provided with at least one lower elastic support arm, the lower elastic support arm is down against the backplane.

Each the upper hook of the two clip blocks protruding downward at least one first oblique extension for buckling to the circuit board. Each the lower hook of the two clip blocks protruding upward at least one second oblique extension for buckling to the backplane of the display panel.

In addition, the circuit board is provided with at least one first locating hole, the upper surface of one of the two clip blocks is extended upward with a first locating pillar which inserts and positions into the at least one first locating hole. The backplane is also provided with at least one second locating hole, the lower surface of one of the two clip blocks is extended downward with a second locating pillar which inserts and positions into the at least one second locating hole.

The two sides of the two clip blocks respectively comprise an inside slope and an outside edge; the elastic arm is connected with the two inside slopes of the two clip blocks. The inside slope mentioned above apply for convenient in bending the two clip blocks; the angular magnitude of the inside slope had designed to be 45° but without restriction The two clip blocks mentioned above, more particularly, comprises a side cross-section for connecting the upper surface and the lower surface; and the side cross-section of the two clip blocks comprises a depression, the display panel can be used for liquid crystal display, liquid crystal display TV, plasma TV or other electronic apparatus for display.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
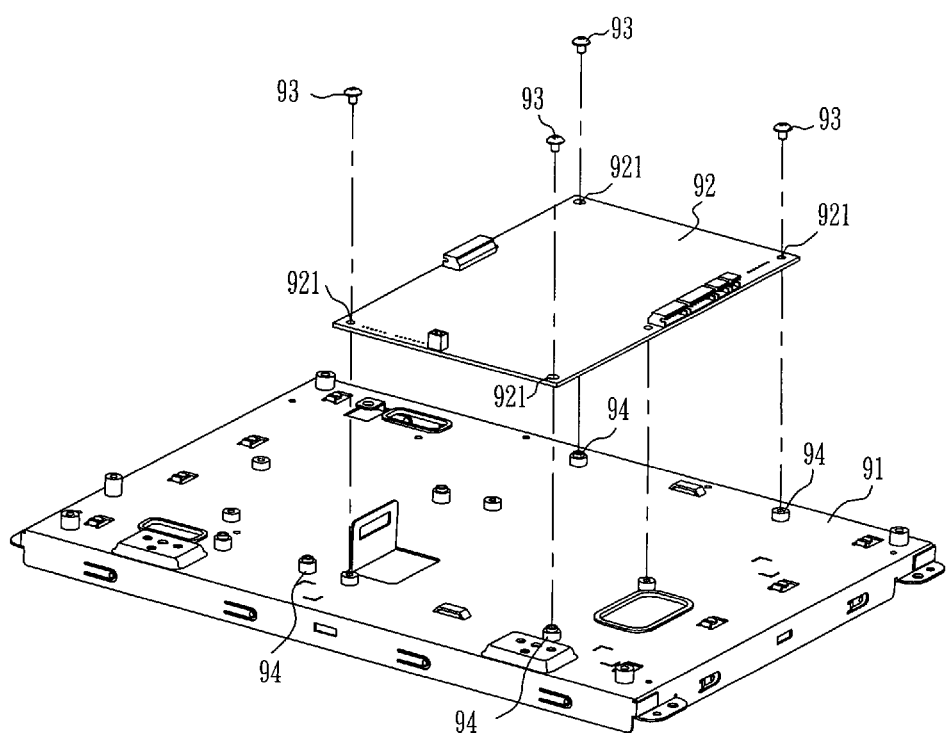
FIG. 1 is an exploded view of the prior art in backplane of liquid crystal display TV and circuit boards.
Figure 2:
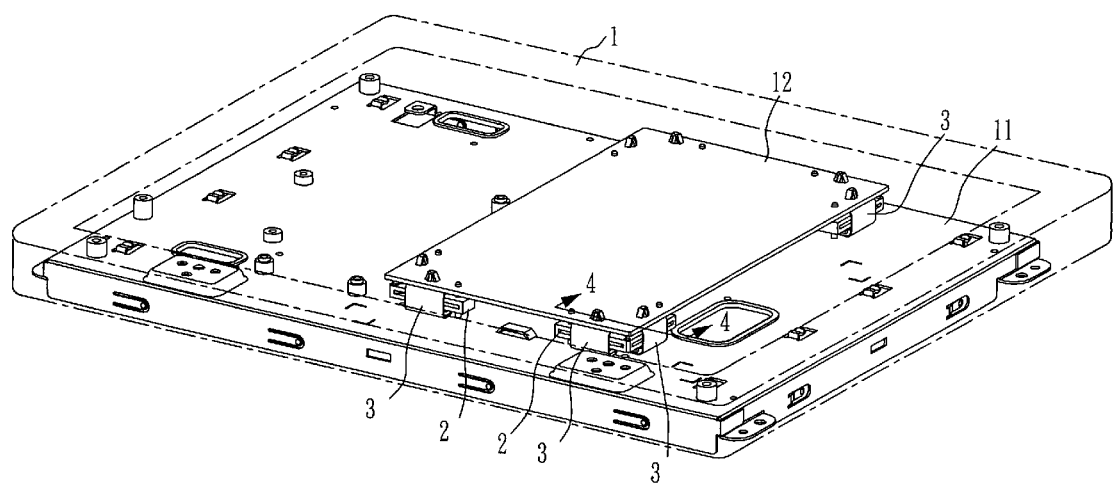
FIG. 2 is a perspective view of the first embodiment of present invention.

FIG. 2 is a perspective view of the first embodiment of present invention, comprising a display panel 1, which is a liquid crystal display panel according to this embodiment, a backplane 11 and a circuit board 12, wherein the circuit board 12 is fasten on the backplane 11 of the display panel 11.

Figure 3:
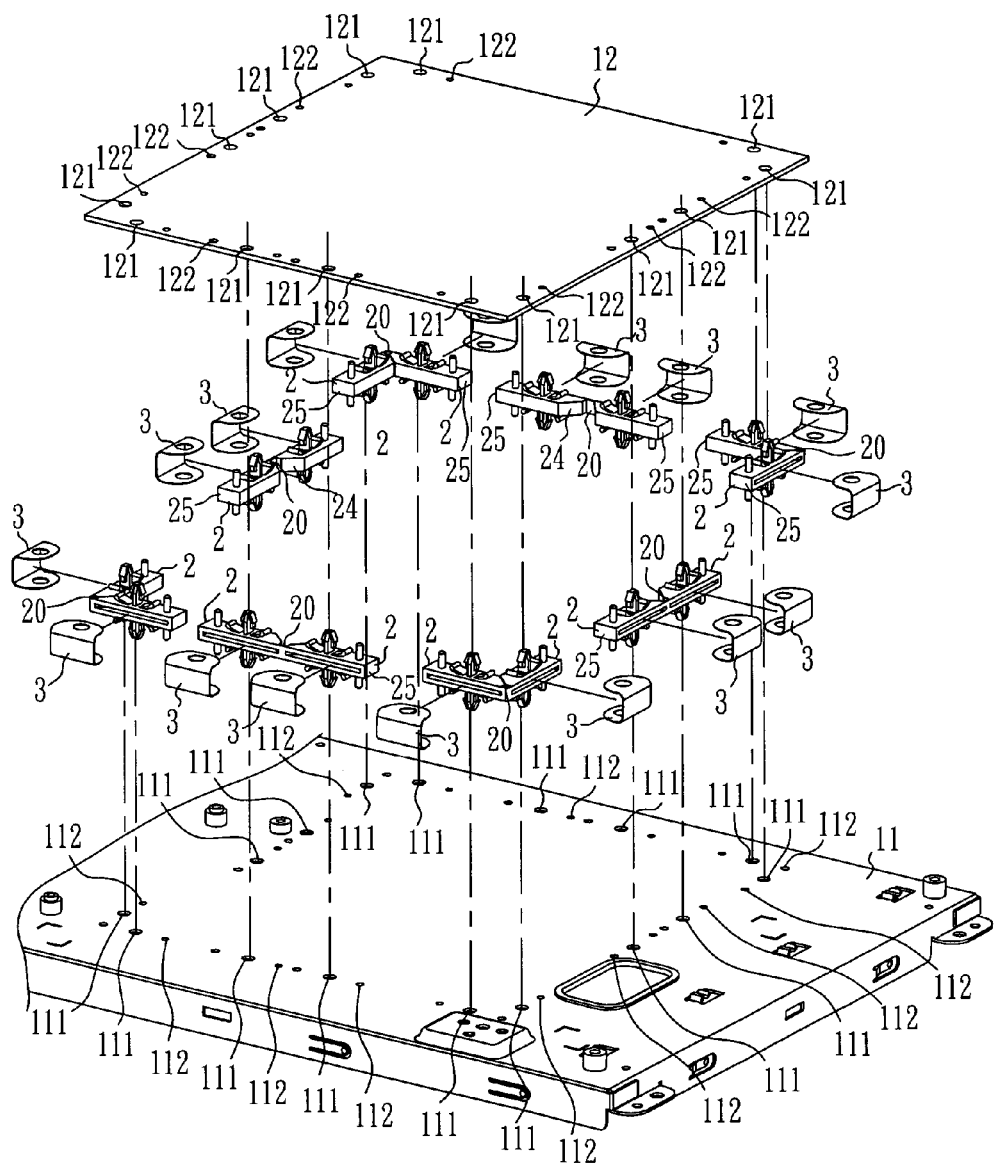
FIG. 3 is an exploded view of the first embodiment of present invention.

With reference to FIG. 2 and FIG. 3, FIG. 3 is an exploded view of the first embodiment of present invention, the backplane 11 mentioned above is provided with a plurality of through holes 111, and the circuit board 12 is provided with a plurality of penetrating holes 121, in this embodiment, the plurality of through holes 111 of backplane 11 and the penetrating holes 121 of circuit board 12 are correspond to each other.

Figure 4:
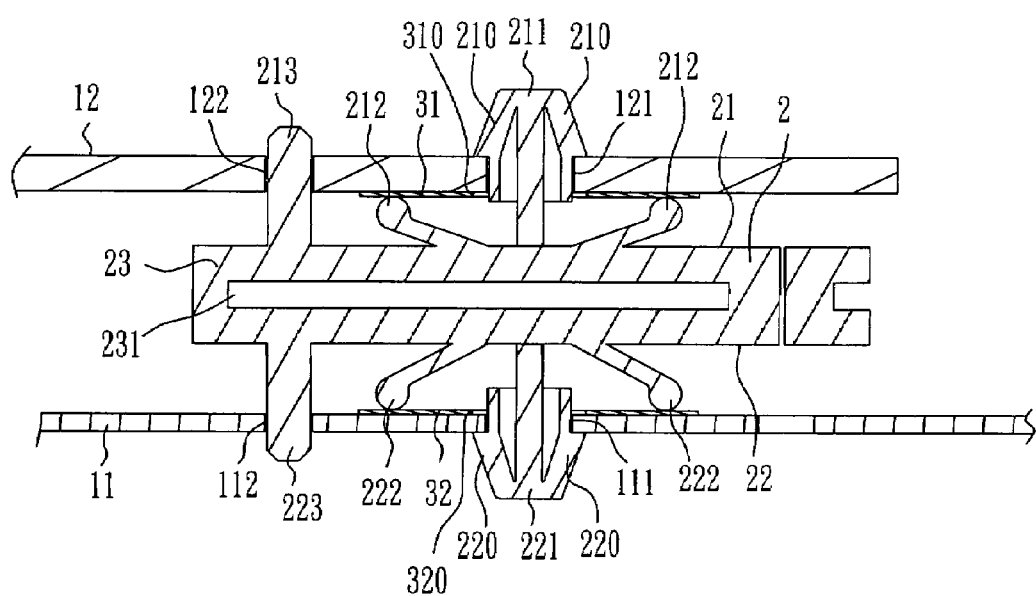
FIG. 4 is a cross-sectional view of the first embodiment of present invention.

With reference to FIG. 2, FIG. 3 and FIG. 4. FIG. 4 is a cross-sectional view of the first embodiment of present invention. To fasten the circuit board 12 on the backplane 11 of the display panel 1, that is to use a plurality of the fasten structure for fastening. Each fasten structure comprises two clip blocks 2 and two U-shaped conducting chips 3, wherein the two clip blocks 2 are connected by an elastic arm 20 therebetween which can be bended to each other, the two clip blocks 2 can be used in the corner of circuit board 12 if the two clip blocks 2 are bended, or the two clip blocks 2 can be used in the side edge of circuit board 12, to bend or not, the elastic arm 20 of the two clip blocks 2 depends on the practical needs.

As shown in FIG. 3, in this embodiment, the corresponding side of the two clip blocks 2 respectively comprises an inside slope 24 and an outside edge 25, and the elastic arm 20 is connected with the inside slopes 24 of the two clip blocks 2, and the inside slope 24 of each of the two clip blocks 2 is designed in 45° for the convenience of combining when bending the two clip blocks 2 to each other, however, the angular magnitude of the mentioned inside slope 24 had designed to be greater or smaller than 45° but without restriction.

As shown in FIG. 4, each of the two clip blocks 2 mentioned above comprising an upper surface 21 and a lower surface 22 respectively, wherein the upper surfaces 21 of the two clip blocks 2 respectively formed upward with an upper hook 211; the lower surfaces 22 of the two clip blocks 2 respectively formed downward with a lower hook 221, the upper surfaces 21 of the two clip blocks 2 is respectively formed up with two upper elastic support arms 212 which is located on the two sides of the upper hooks 211; in the same way, the lower surfaces 22 of the two clip blocks 2 is respectively downward provided with two lower elastic support arms 222 which is located on the two sides of the lower hooks 221.

Besides, with reference to FIG. 4, the upper hook 211 of each clip block 2 protruding downward two upper first oblique extensions 210, in the same way, the lower hook 221 of each clip block 2 protruding upward two lower second oblique extensions 220; each clip block 2 comprises a side cross-section 23 for connecting the upper surface 21 and the lower surface 22; and the side cross-section 23 of each clip block 2 comprises a depression 231 for avoiding from shrinking problem.

On the other hand, with reference to FIG. 3 and FIG. 4, two U-shaped conducting chips 3 are respectively sandwiched between the backplane 11 and the circuit board 12, each U-shaped conducting chip 3 comprises an upper fold slice 31 and a lower fold slice 32, the upper fold slice 31 is provided with an upper opening 310; and the lower fold slice 32 are provided with a lower opening 320.

With reference from FIG. 2 to FIG. 4, when applying to fasten the circuit board 12 on the backplane 11 of the display panel 1, to install the two clip blocks 2 between the circuit board 12 and the backplane 11, then the upper hook 211, which is formed upward from the upper surface 21 of each clip block 2, respectively corresponds and hook with the penetrating holes 121 on the circuit board 12; the lower hook 221, which is formed downward from the lower surface 22 of each clip block 2, respectively corresponds and hook with the through holes 111 on the backplane 11; in the same time, each upper fold slice 31 of the U-shaped conducting chip 3 is respectively sandwiched between the upper surface 21 of each clip block 2 and the circuit board 12, the upper opening 310 corresponds sleeved onto the upper hook 211 of the clip block 2; each lower fold slice 32 of the U-shaped conduct chip 3 is respectively sandwiched between the lower surface 22 of each clip block 2 and the backplane 11, the lower opening 320 corresponds sleeved onto the lower hook 221 of the clip block 2.

In addition, the two upper elastic supporting arms 212 formed upward and located adjacent to the upper hook 211 of the upper surface 21 of each clip block 2 are respectively up against the circuit board 12, the two lower elastic supporting arms 222 formed downward and located adjacent to the lower hook 221 of the lower surface 22 of each clip block 2 are respectively down against the backplane 11, in the same time, the upper hook 211 of each clip block 2 obliques downward and provides with two upper first oblique extensions 210 which correspond and buckled to the circuit board 12, the lower hook 221 of each clip block 2 obliques upward and provides with two lower second oblique extensions 220 which correspond and buckled to the backplane 11.

With reference from FIG. 3, in the process mentioned above, for locating the two clip blocks 2 correctly between the circuit board 12 and the backplane 11, it provides respectively with a plurality of first locating holes 122 on the circuit board 12 and a plurality of second locating holes 112 on the backplane 11; the plurality of first locating holes 122 and second locating holes 112 are respectively located on the two sides of the penetrating holes 121 and the through holes 111 in addition to correspond to each other; the upper surfaces 21 of the two clip blocks 2 is formed up with a first locating pillars 213 respectively, which inserts and positions into the first locating holes 122 on the circuit board 12 respectively; the lower surfaces 22 of the two clip blocks 2 is formed down with a second locating pillars 223 respectively, which inserts and positions into the second locating holes 112 on the on the backplane 11 respectively.

Therefore, according to the present invention of a fasten structure mentioned above, the circuit board 12 and the backplane 11 of the display panel 1 can be fastened by the upper hook 211 and the lower hook 221 of the two clip blocks 2, the circuit board 12 and the backplane 11 of the display panel 1 can also achieve the function of electric conducting, furthermore, to save the pillars and screws which are used in the prior method, the present invention is not only lower the production cost by reducing the components but to fasten easily and faster, because of omitting the screw lacking method of prior art which is essentially to lack on pillars first then screws, substantially avoiding labor and time consuming.

Moreover, to different sizes of the circuit board 12, to set the penetrating holes 121 on the circuit board 12 only depends on the practical needs, one can apply the present invention of the fasten structure of the upper hooks 211 and the lower hooks 221 on the two clip blocks 2 for fastening the circuit board 12 on the backplane 11 of the display panel 1, therefore to achieve using different sizes of the circuit board 12 on the same backpanel 11, the upper hooks 211 and the lower hooks 221 are not essentially correspond to each other but staggered depends on the practical needs.

Figure 5:
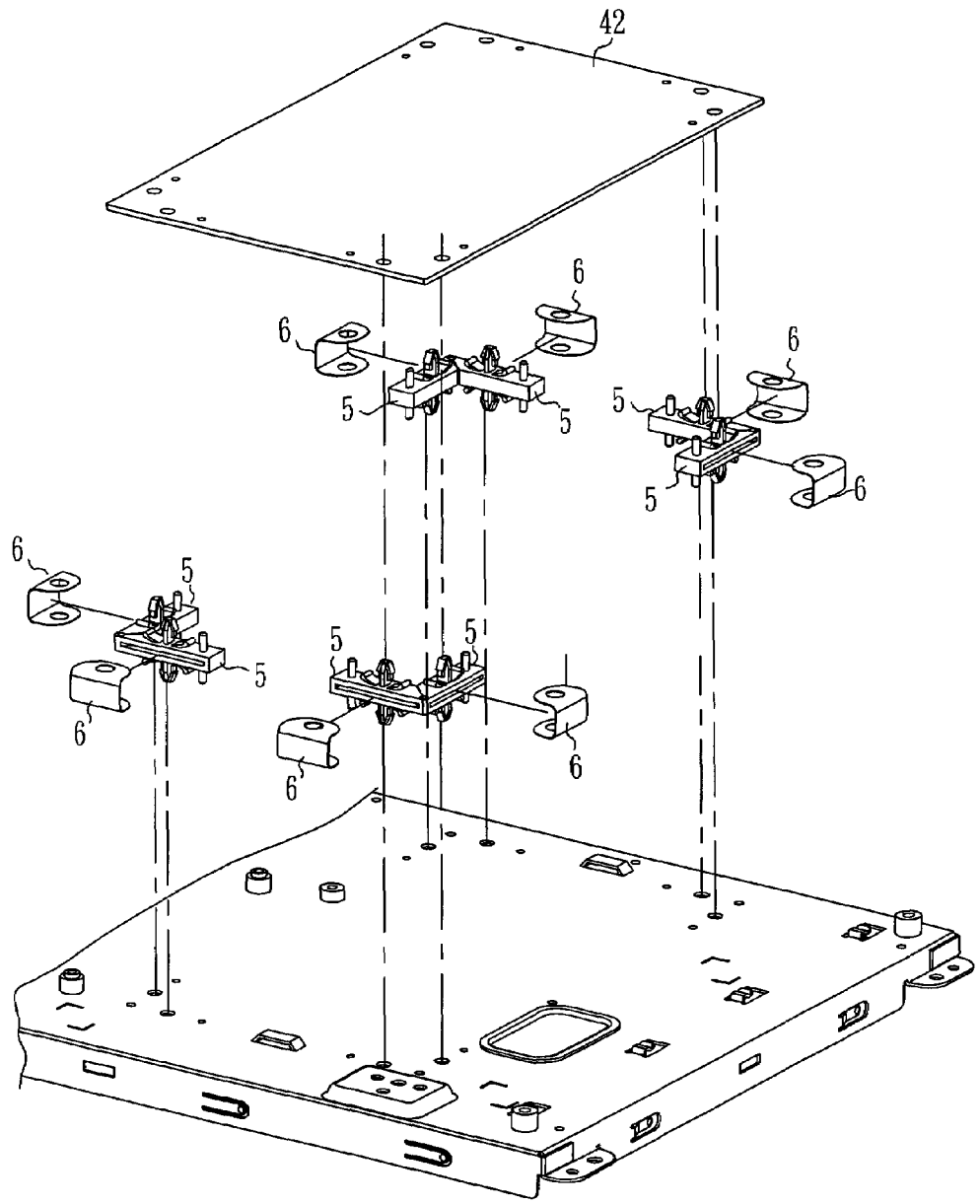
FIG. 5 is an exploded view of the second embodiment of present invention.

FIG. 5 is an exploded view of the second embodiment of present invention, the main structure of the second embodiment is the same with the first embodiment, the only different in the second embodiment is the circuit board 42 which is a smaller size of circuit board, so it only needs to set the two clip blocks 5 and electric conducting chips 6 in the corner of the circuit board 42, and it is provided with the same function in first embodiment.

Although the present invention has been explained in relation to its preferred embodiment, it is to be understood that many other possible modifications and variations can be made without departing from the spirit and scope of the invention as hereinafter claimed.

What is claimed is:

1. A fastening structure for fastening a circuit board onto a backplane of a display panel; said backplane being provided with at least two through holes; said circuit board being provided with at least two penetrating holes; and wherein said fastening structure comprises:

two clip blocks, said two clip blocks being connected by an elastic arm, said elastic arm being configured to extend between said two clip blocks and to be flexible to the degree that each of said clip blocks can be selectively moved from a spaced aligned state toward each other to assume an angled engaged state via flexure of the elastic arm, said two clip blocks respectively comprising an inside slope and an outside edge, said elastic arm being connected with said two clip blocks in a manner which allows the inside slopes to engage one another when the two clip blocks are moved into the engaged angled state; each clip block comprising an upper major surface and a lower major surface; said upper major surfaces of said two clip blocks being formed with upper hooks that respectively pass through and hook with said at least two penetrating holes of said circuit board; said lower major surfaces of said two clip blocks being formed with lower hooks that respectively pass through and hook with said at least two through holes of said backplane; and two U-shaped conducting chips, each U-shaped conducting chip being configured to fit onto a single clip block and each comprising an upper fold slice, a lower fold slice, an upper opening located on said upper fold slice, and a lower opening located on said lower fold slice, said upper fold slices of said two U-shaped conducting chips respectively being configured to be between said upper major surfaces of said two clip blocks and said circuit board, said upper openings being configured to be sleeved onto said upper hooks correspondingly; said lower fold slices of said two U-shaped conducting chips respectively being configured to be between said lower major surfaces of said two clip blocks and said backplane, said lower openings being configured to be sleeved onto said lower hooks.

2. The fastening structure as in claim 1, wherein each said upper major surface of said two clip blocks is provided with at least one upper elastic support arm, said at least one upper elastic arm extending toward said circuit board.

3. The fastening structure as in claim 1, wherein each said lower surface of said two clip blocks is provided with at least one lower elastic support arm, and wherein said at least one lower elastic support arm is configured to extend down toward said backplane.

4. The fastening structure as in claim 1, wherein each said upper hook of said two clip blocks is configured to protrude downward for buckling to said circuit board.

5. The fastening structure as in claim 1, wherein each said lower hook of said two clip blocks is configured to protrude upward for buckling to said backplane.

6. The fastening structure as in claim 1, wherein said circuit board comprising at least one first locating hole, and wherein said upper surface of one of said two clip blocks is extended upward with a first locating pillar which is configured for insertion into said at least one first locating hole.

7. The fastening structure as in claim 1, wherein said backplane comprises at least one second locating hole, said lower surface of one of said two clip blocks comprises a second locating pillar which is configured to be inserted into said at least one second locating hole.

8. The fastening structure as in claim 1, wherein said two clip blocks respectively comprises a side cross-section configured for connecting said upper surface and said lower surface, said side cross-section comprising a depression.

* * * * *